United States Patent [19]
Kunishi

[11] Patent Number: 6,109,932
[45] Date of Patent: Aug. 29, 2000

[54] THREE-DIMENSIONAL ELECTRICAL INTERCONNECTION SYSTEM

[75] Inventor: Shinsuke Kunishi, Hadano, Japan

[73] Assignee: Molex Incorporated, Lisle, Ill.

[21] Appl. No.: 08/934,870

[22] Filed: Sep. 22, 1997

[30] Foreign Application Priority Data

Dec. 13, 1996 [JP] Japan ................................. 8-353071

[51] Int. Cl.⁷ ................................................. H01R 9/09
[52] U.S. Cl. ........................................... 439/76.2; 439/931
[58] Field of Search .............................. 439/55, 66, 76.1, 439/76.2, 931, 949

[56] References Cited

U.S. PATENT DOCUMENTS

| | | |
|---|---|---|
| 4,603,930 | 8/1986 | Ito . |
| 4,632,492 | 12/1986 | Yamada . |
| 4,738,631 | 4/1988 | Takahashi et al. ..................... 439/248 |
| 4,895,536 | 1/1990 | Gingerich et al. ..................... 439/885 |
| 4,978,307 | 12/1990 | Billman et al. ......................... 439/83 |
| 5,057,026 | 10/1991 | Sawai et al. .......................... 439/76.2 |
| 5,320,558 | 6/1994 | von Roretz ............................. 439/441 |
| 5,382,169 | 1/1995 | Bailey et al. .......................... 439/76.2 |
| 5,509,812 | 4/1996 | Comerci et al. ....................... 439/76.1 |
| 5,599,201 | 2/1997 | Sommer et al. ........................ 439/441 |
| 5,622,507 | 4/1997 | Kasai .................................... 439/34 X |

FOREIGN PATENT DOCUMENTS

| | | | |
|---|---|---|---|
| 0 387 845 | 9/1990 | European Pat. Off. | ......... H05K 7/02 |
| 3-284111 | 12/1991 | Japan | ................ H02G 3/16 |
| 7-312467 | 11/1995 | Japan | ................ H05K 1/02 |

*Primary Examiner*—Khiem Nguyen
*Attorney, Agent, or Firm*—Stephen Z. Weiss

[57] ABSTRACT

A molded electrical interconnection system includes a three-dimensional molded dielectric substrate including at least one open socket. Stamped and formed electrical circuitry is embedded in the molded substrate and includes a contact blade projecting into the socket. An interface module is positioned in the socket to define a receptacle for receiving a male terminal of a complementary connecting device.

5 Claims, 12 Drawing Sheets

THREE-DIMENSIONAL ELECTRICAL INTERCONNECTION SYSTEM

FIELD OF THE INVENTION

This invention generally relates to the art of electrical connectors and, particularly, to a molded electrical interconnection system which has stamped and formed electrical circuitry.

BACKGROUND OF THE INVENTION

Printed circuit boards have been used for many years in the electrical industry. A typical printed circuit board includes a flat (versus three-dimensional) substrate having a pattern of circuit traces printed or otherwise deposited thereon. Electronic components are electrically coupled to the circuit traces on one or both sides of the flat substrate by solder connections to contact pads of the circuit traces. Often, solder tails from the electrical components are inserted into holes in the flat substrate, and the tails are soldered to the circuit traces on the board and/or in the holes. These solder connections require expensive and often tedious processes. If a solder connection becomes damaged, its repair also is expensive and tedious.

In some electrical fields, such as in the automotive industry, three-dimensional circuit structures have been developed wherein a plurality of stamped and formed conductors are embedded, as by overmolding, in a three-dimensional molded dielectric substrate. The conductors have contact tabs or blades which project from the substrate. In some instances, the blades may be disposed in recesses in the substrate. The molded substrate is designed to permit mounting of electrical devices or parts thereon, such as relays, switches, terminal boards or the like, making required electrical connections between the devices or parts through the conductors embedded in the substrate. Again, expensive and tedious solder connections are used even with such pre-dimensional circuit structures. To avoid the solder connections, expensive and complicated covers have been used over the three-dimensional substrate, or the various electrical devices or parts are connected directly to the formed tabs of the conductors, but these connections typically require female contacts.

The present invention is directed to providing a three-dimensional circuit structure which utilizes novel interface modules to provide an interconnection between the conductors of the circuit structure and the electrical devices or parts connected to the structure. The interface modules are particularly useful as male-to-male interfacing modules.

SUMMARY OF THE INVENTION

An object, therefore, of the invention is to provide a new and improved electrical interconnection system, such as a three-dimensional molded interconnection system.

In the exemplary embodiment of the invention, the system includes a three-dimensional molded dielectric substrate having at least one open socket. Stamped and formed electrical circuitry is embedded in the molded substrate. The circuit includes a contact blade projecting into each open socket. An interface module is positioned in the socket to define a receptacle for receiving a male terminal of a complementary connecting device.

Specifically, the interface module comprises a terminal block having a dielectric block generally of the configuration of the socket. An interconnecting terminal is mounted on the dielectric block for interconnecting the contact blade of the electrical circuitry with the male terminal of the complementary connecting device.

As disclosed herein, the interconnecting terminal is generally S-shaped to define two resilient legs at opposite ends thereof. One of the legs is adapted for engaging the contact blade of the electrical circuitry in the socket of the dielectric substrate. The other leg is adapted to engage the male terminal of the complementary connecting device inserted into the socket. The other leg of the S-shaped interconnecting terminal is located to sandwich the male terminal of the complementary connecting device between the other leg and a wall of the socket. In essence, the interface terminal forms a spring means for biasingly engaging both the contact blade of the electrical circuitry and the male terminal of the complementary connecting device.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
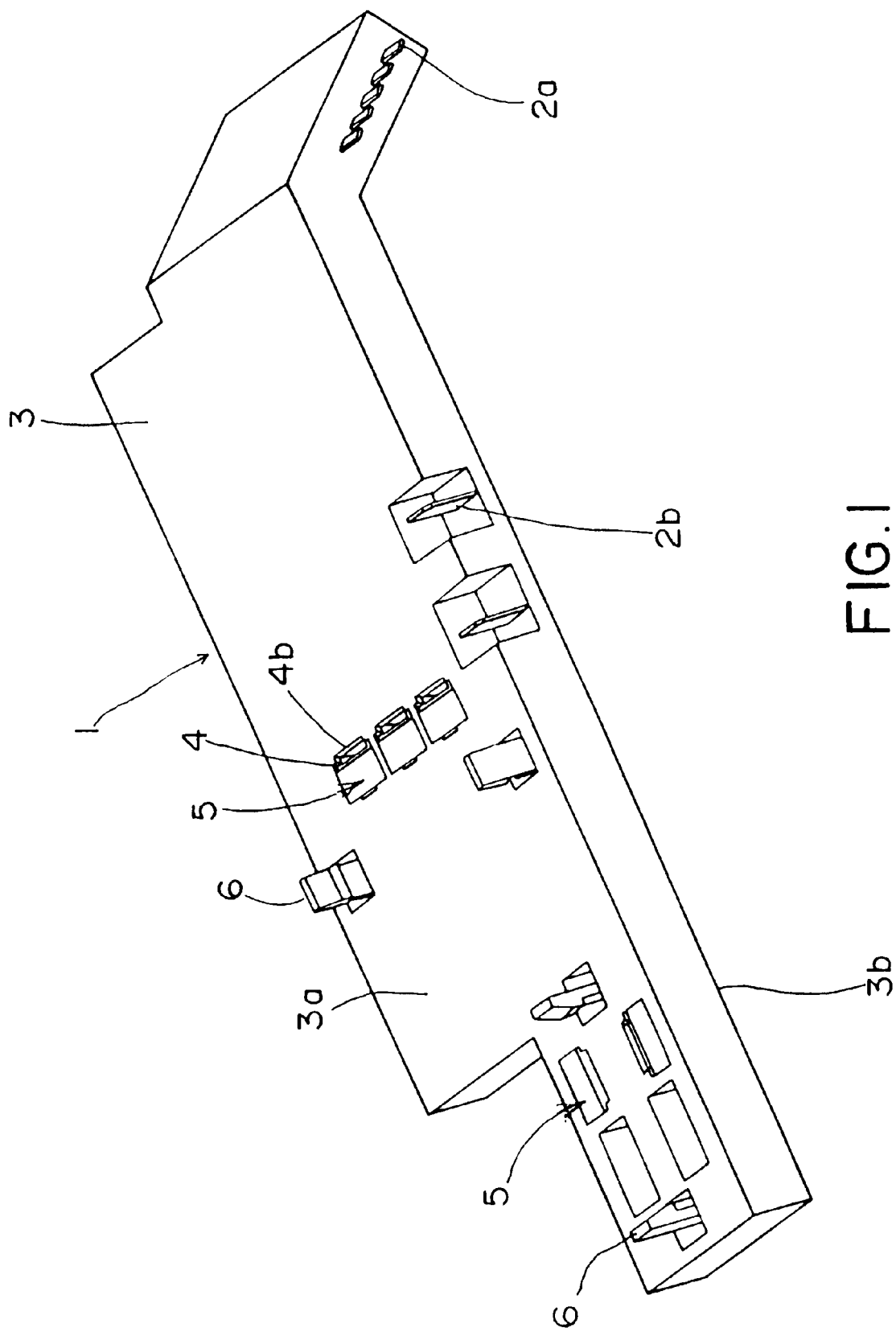
FIG. 1 is a perspective view of the three-dimensional circuit structure of the invention.
Figure 2:
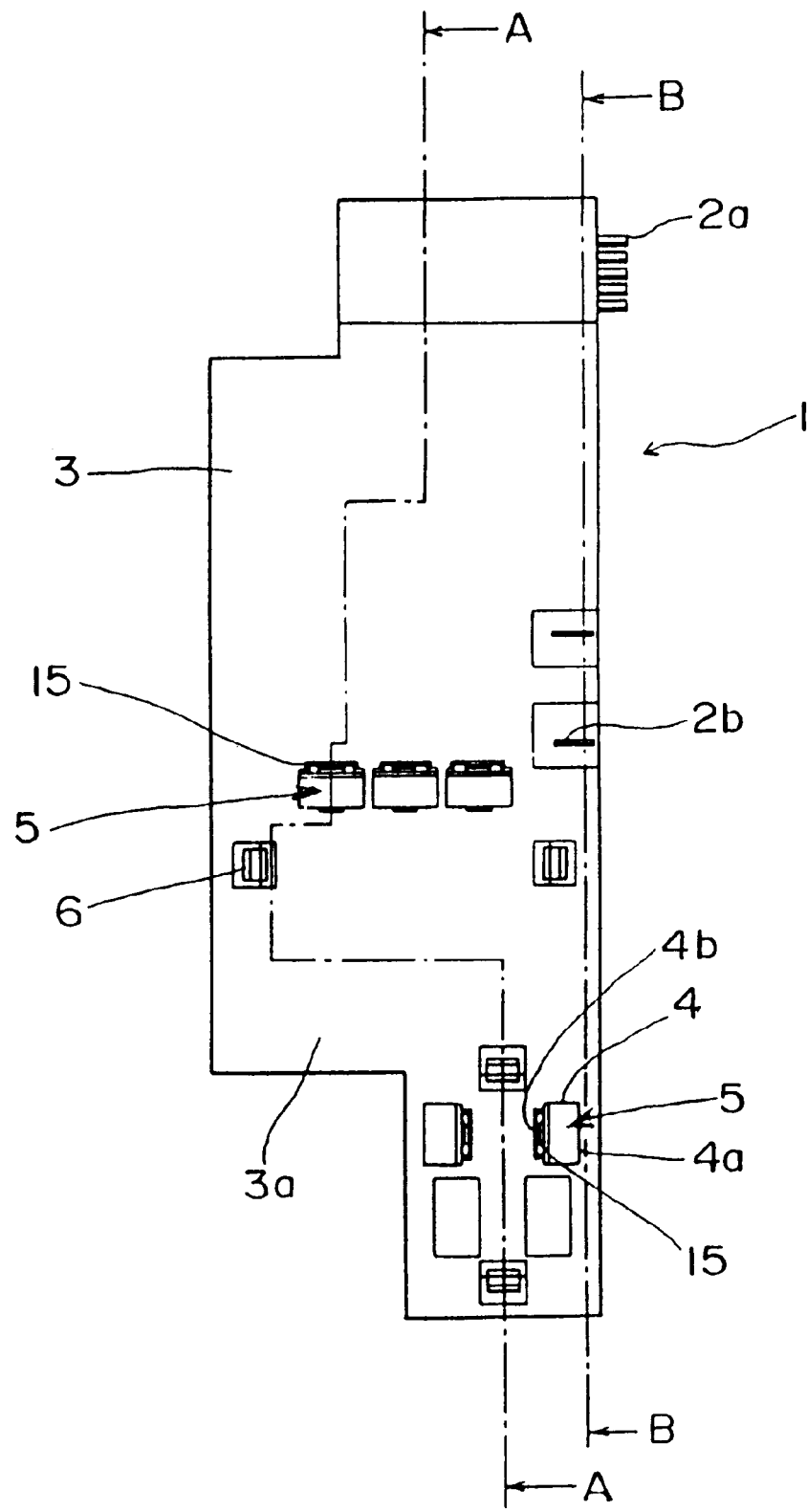
FIG. 2 is a top plan view of the circuit structure.
Figure 3:
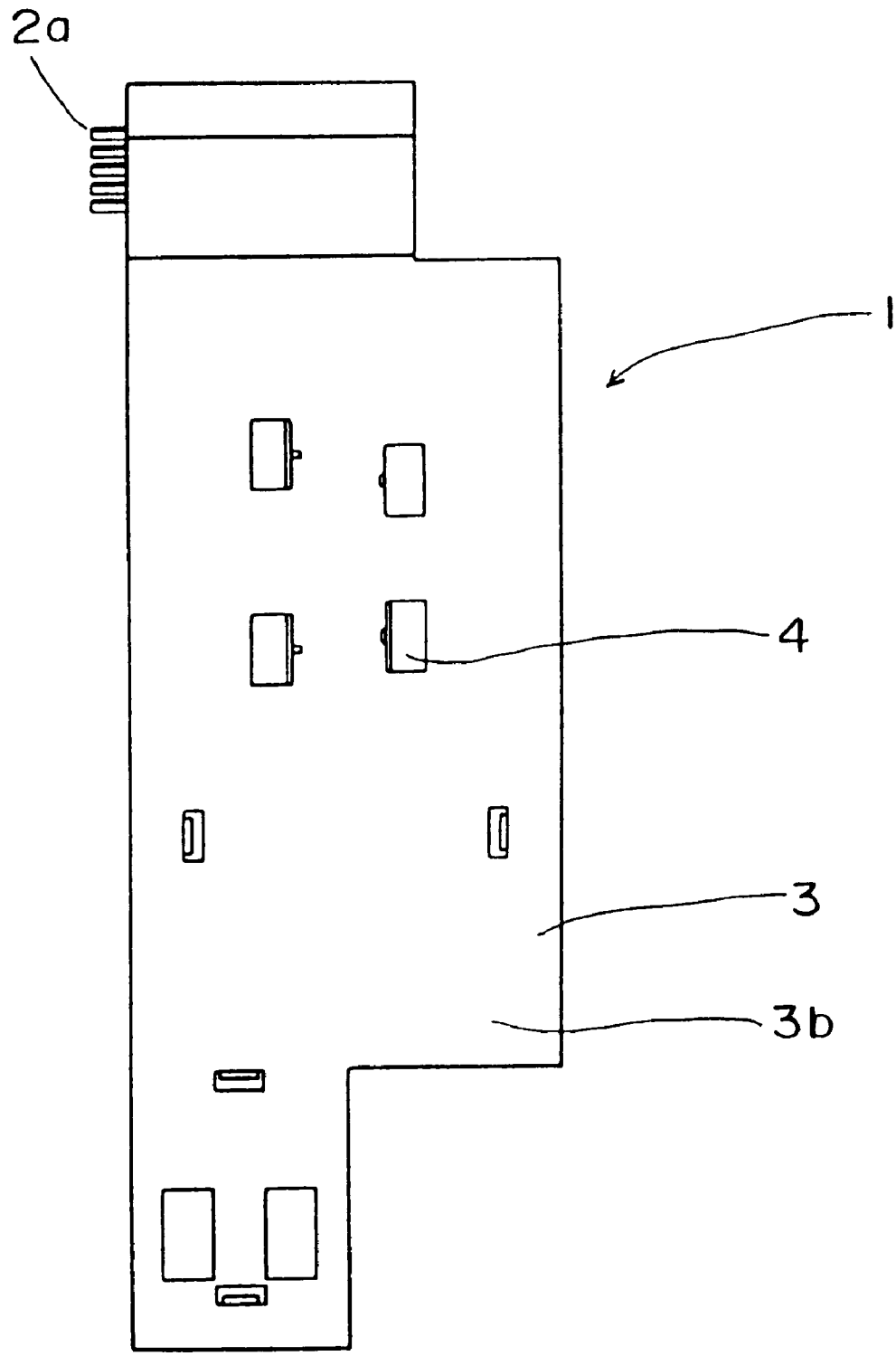
FIG. 3 is a bottom plan view of the circuit structure.
Figure 4:
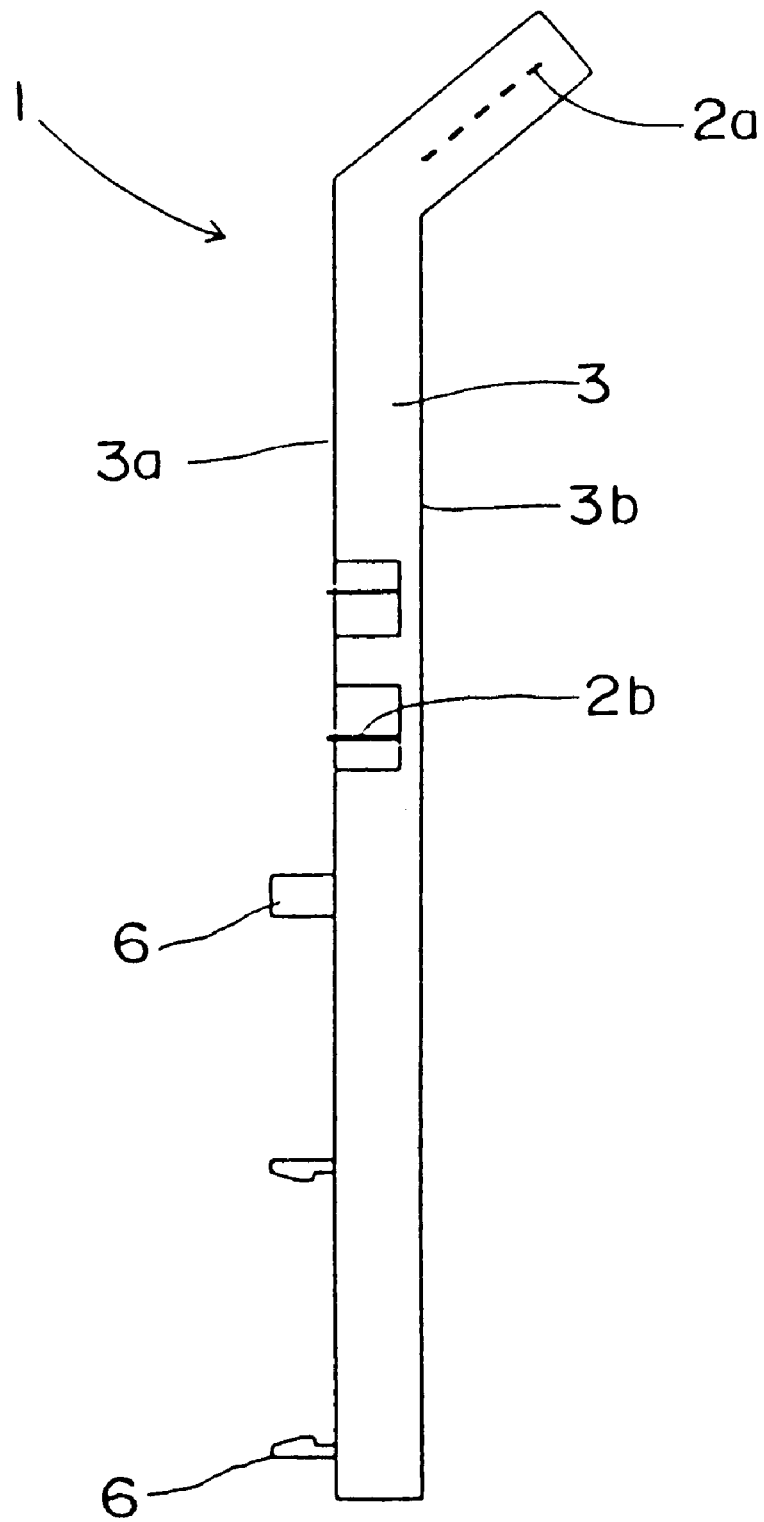
FIG. 4 is a front elevational view of the circuit structure.
Figure 5:
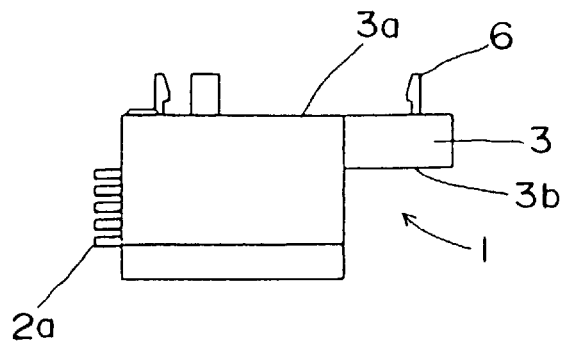
FIG. 5 is an end elevational view of the circuit structure, looking toward the left-hand end of FIG. 1.
Figure 6:
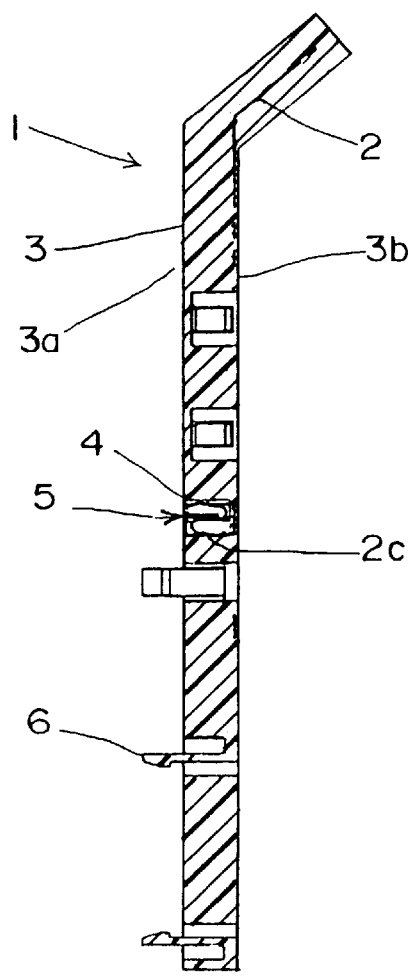
FIG. 6 is a vertical section taken generally along line A—A of FIG. 2.
Figure 7:
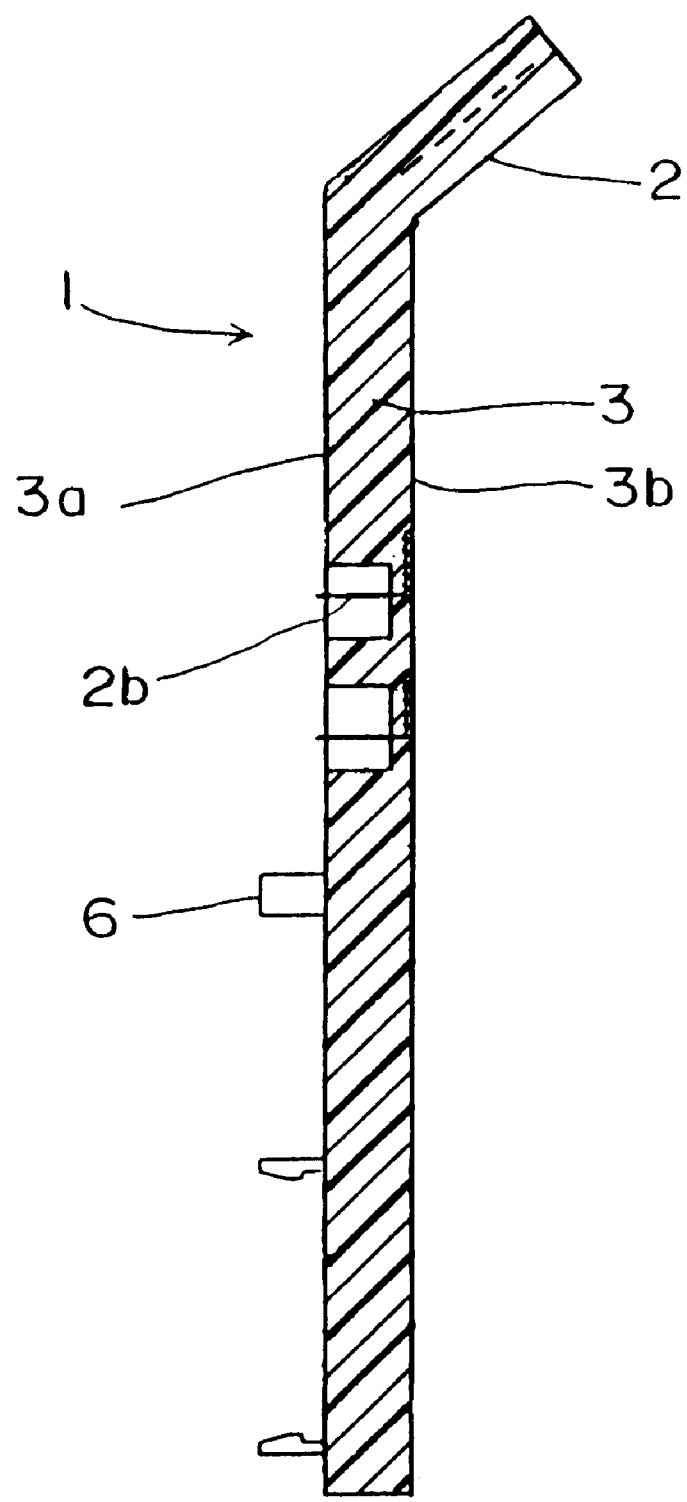
FIG. 7 is a vertical section taken generally along line B—B in FIG. 2.

Referring to the drawings in greater detail, and first to FIGS. 1–7, the invention is embodied in a molded electrical interconnection system in the form of a three-dimensional circuit structure, generally designated 1. The structure includes a three-dimensional molded dielectric substrate 3 which is molded with a plurality of open recesses or sockets 4. As seen in the drawings, molded dielectric substrate 3 has a top surface 3a and a bottom surface 3b. Each open socket 4 has an interior side wall 4b for reference purposes hereinafter. A plurality of interface modules or terminal blocks, generally designated 5, are inserted into sockets 4. The interface modules will be described in greater detail hereinafter. Hooked latches 6 are molded integrally with dielectric substrate 3 and project upwardly beyond top surface 3a thereof.

Figure 8:
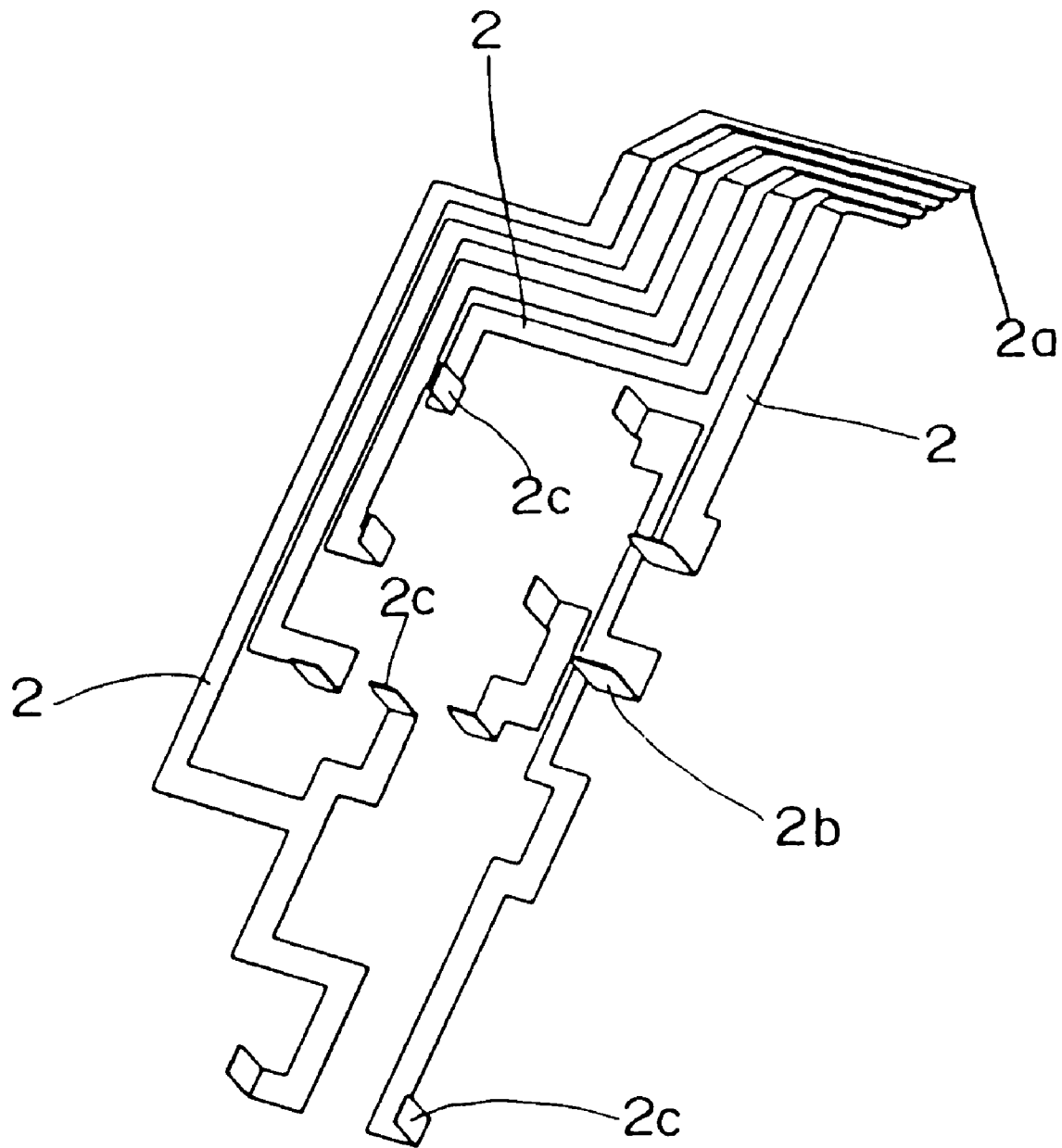
FIG. 8 is a perspective view of the stamped and formed electrical circuitry.
Figure 9:
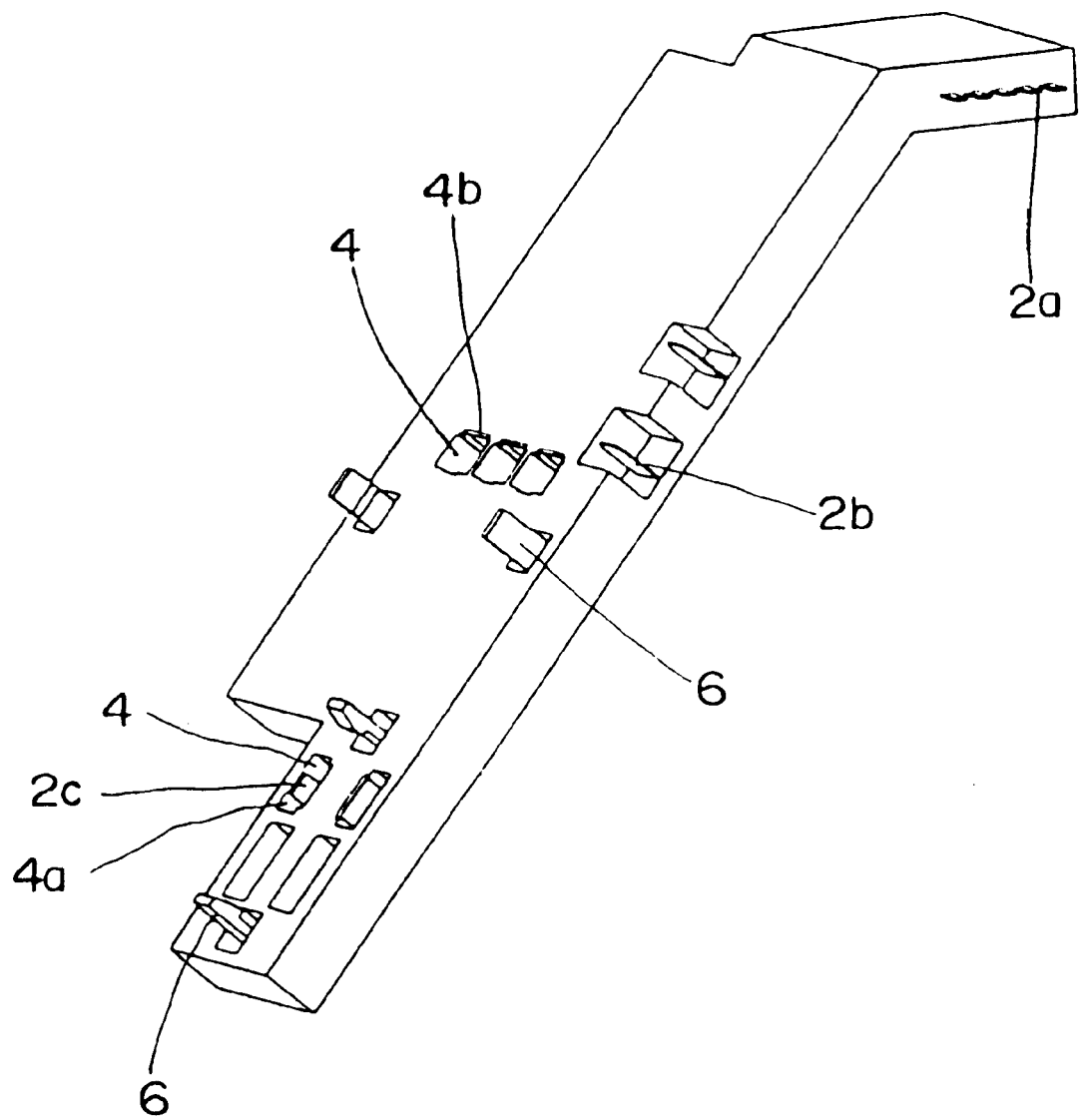
FIG. 9 is a perspective view similar to that of FIG. 1, on a reduced scale and with the interface modules removed from the sockets in the substrate.
Figure 10:
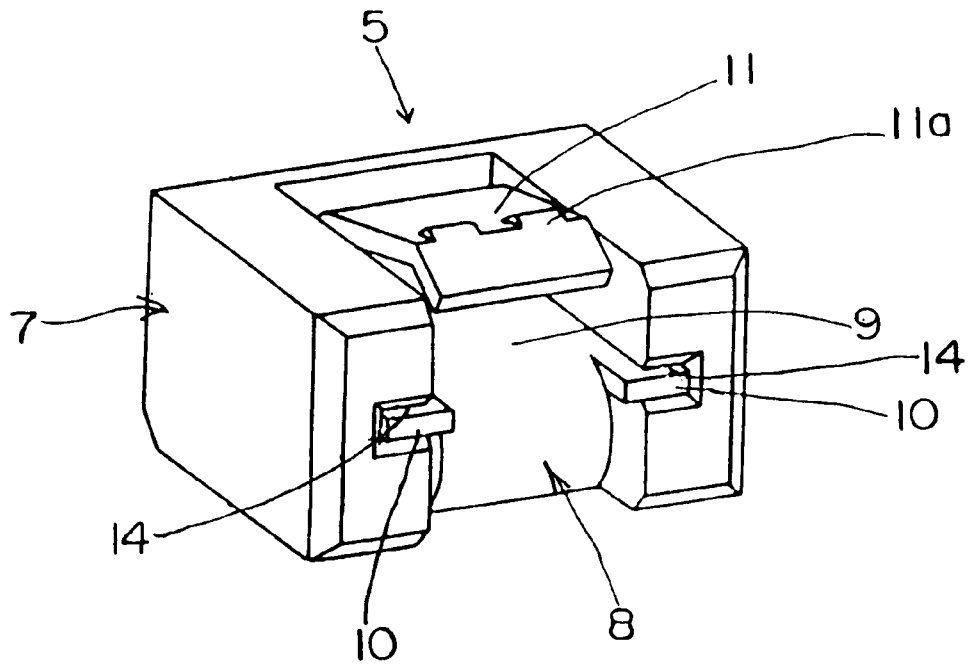
FIG. 10 is a perspective view of one of the interface modules.
Figure 11:
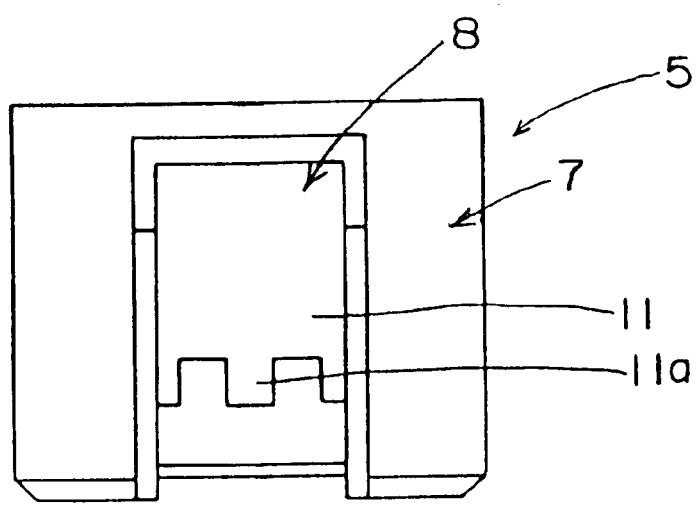
FIG. 11 is a top plan view (as viewed in FIG. 10) of the interface module.
Figure 12:
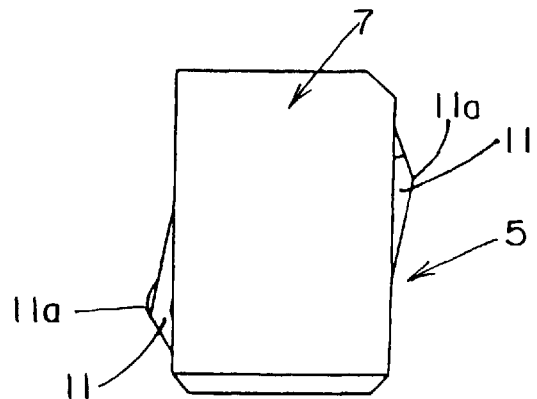
FIG. 12 is a side elevational view of the interface module.
Figure 13:
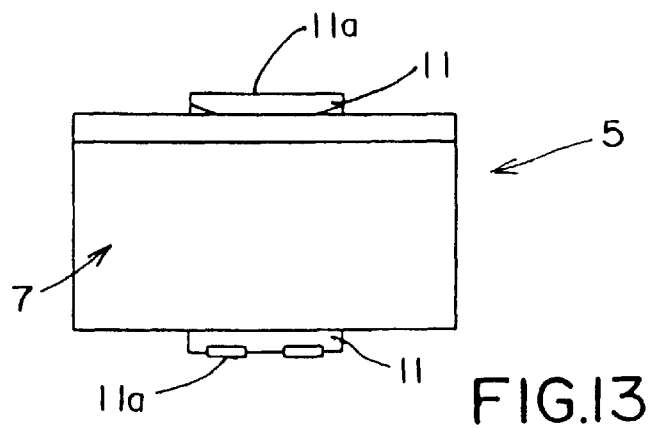
FIG. 13 is a rear elevational view of the interface module.

FIG. 8 shows a pattern of stamped and formed electrical circuitry or conductors 2 which are generally coplanar. The conductors have upstanding contact blades 2b and 2c which are located for projecting into open sockets 4 of molded dielectric substrate 3. The circuit structure is manufactured by overmolding dielectric substrate 3 over the stamped and formed electrical circuitry shown in FIG. 8, with contact blades 2b and 2c projecting freely into sockets 4 of the substrate. Conductors 2 also have terminal blades 2a which can be used to plug the entire molded electrical interconnection system or circuit structure 1 into an outside connecting device. Terminal blades 2a are shown in various figures, including FIG. 1, projecting from a side of dielectric substrate 3 which is overmolded about the stamped and formed electrical circuitry, including flat coplanar conductors 2.

One of the interface modules 5 is shown in FIGS. 10–14. The interface module is a two-piece structure including an interconnecting terminal 8 which is shown in FIGS. 15 and 16 and a dielectric block 7 which is shown in FIG. 17.

Figure 14:
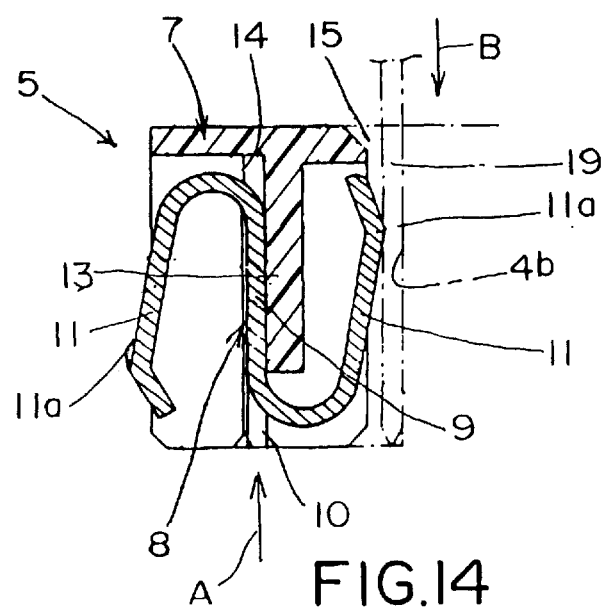
FIG. 14 is a vertical section through the interface module.
Figure 15:
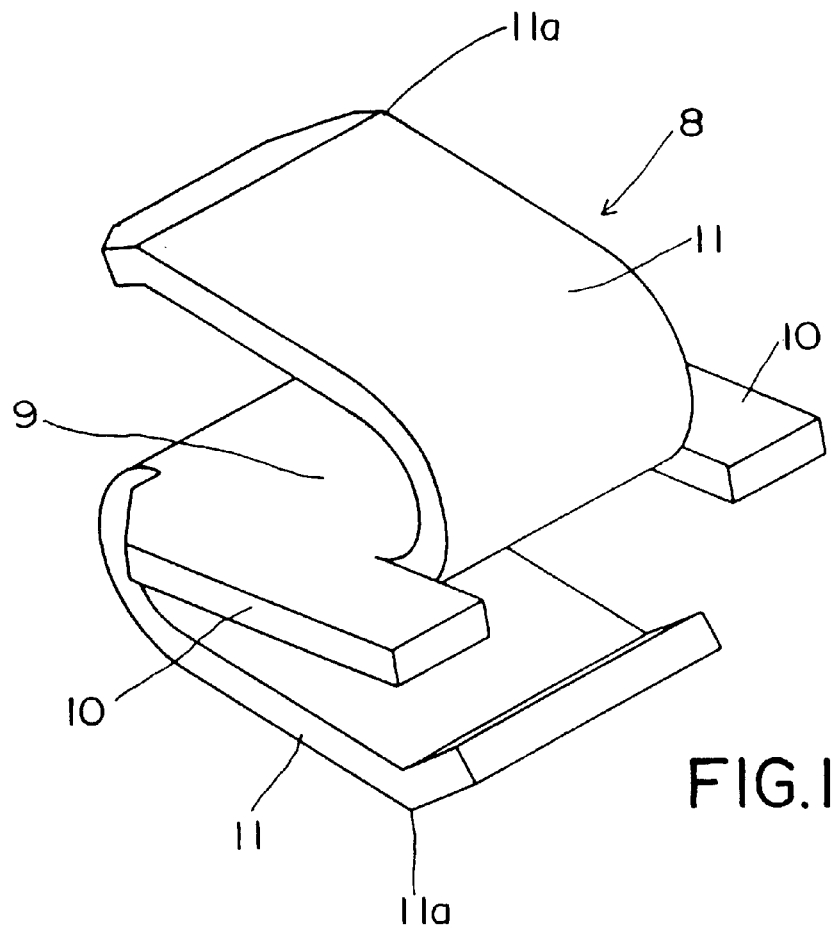
FIG. 15 is a perspective view of the interconnecting terminal of the interface module.
Figure 16:
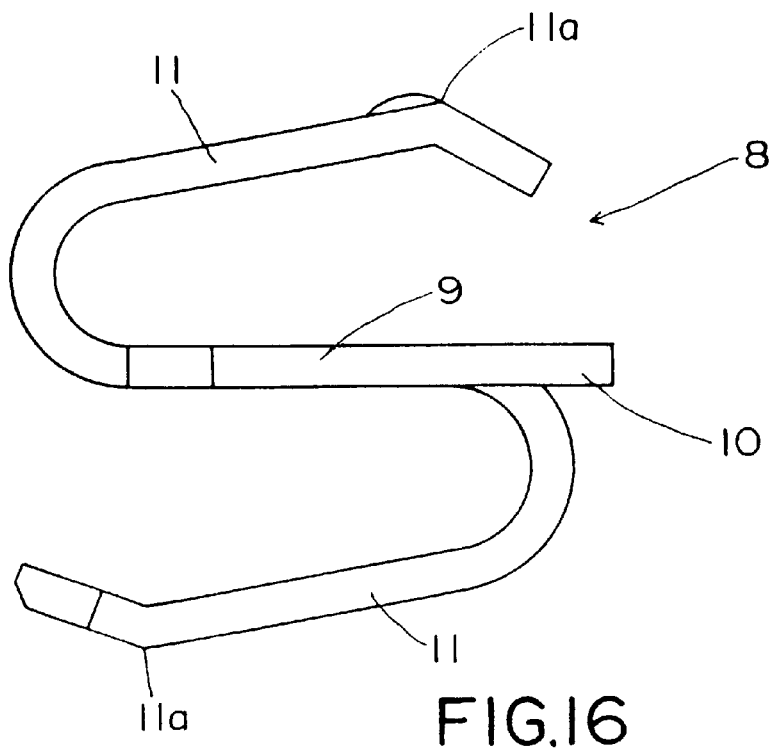
FIG. 16 is a side elevational view of the interconnecting terminal.

Referring first to FIGS. 15 and 16 in conjunction with FIGS. 10–14, the interconnecting terminal of interface module 5 is generally designated 8. The terminal is generally S-shaped (or Z-shaped) and includes a center base 9 having engagement projections 10 formed on opposite sides of the base for press-fitting the interconnecting terminal into the dielectric block of the interface module as seen best in FIG. 10. The S-shaped interconnecting terminal 8 defines two resilient legs 11 at opposite ends thereof, i.e. at opposite sides of base 9. The terminal is stamped and formed of sheet metal material, resulting in legs 11 being resilient. The legs have outwardly facing contact ends 11a.

Figure 17:
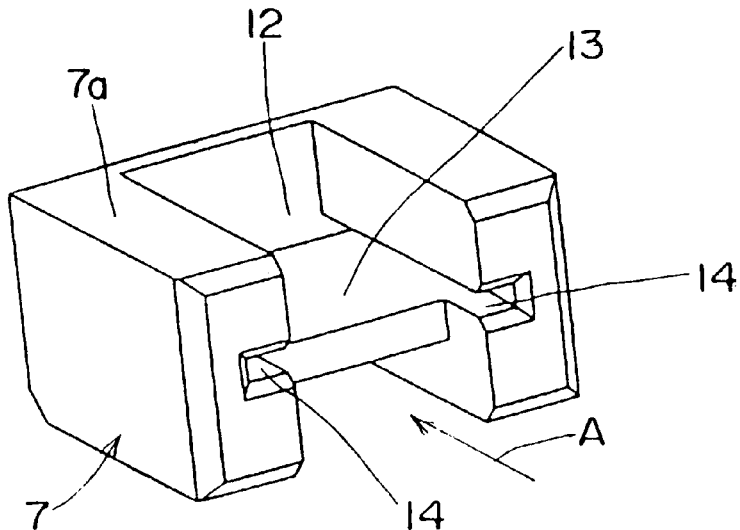
FIG. 17 is a perspective view of the dielectric block of the interface module.

Referring to FIG. 17 in conjunction with FIGS. 10–14, the dielectric block or insulating housing of each interface module 5 is generally designated 7. The dielectric block has a cavity 12 divided by a central partition 13. A pair of slots are formed in the block adjacent partition 13. In assembly, the interconnecting terminal is inserted into cavity 12 in dielectric block 7 in the direction of arrows "A" (FIGS. 14 and 17). During insertion, engagement projections 10 of the terminal are press fit into slots 14 of the dielectric block, whereby resilient legs 11 are disposed on opposite sides of partition 13 as best seen in FIG. 14.

The assembled interface modules 5 are inserted into respective ones of open sockets 4 in three-dimensional molded dielectric substrate 3 to complete the electrical interconnection system or circuit structure 1 of the invention. Each interface module 5 is inserted into a respective one of the sockets so that one of the resilient legs 11 of the respective interconnecting terminal 8 is in engagement with the respective contact blade 2b of the stamped and formed electrical circuitry that is located in that respective socket. The opposite leg 11 of the interconnecting terminal is in position for engaging a male terminal 19 inserted into the socket from a complementary connecting device. This is shown in FIG. 14 wherein the male terminal 19 is illustrated in phantom in a gap 15 between the leg 11 of the interconnecting terminal 8 and wall 4b of the socket. In essence, the inserted male terminal becomes sandwiched between wall 4b and the contact portion 11a of the terminal leg, with the leg acting as a spring means to biasingly engage the male terminal. The opposite leg 11 of the interconnecting terminal also acts as a spring means for biasingly engaging the respective contact blade 2b of the stamped and formed circuitry at the opposite side of the respective socket.

Figure 18:
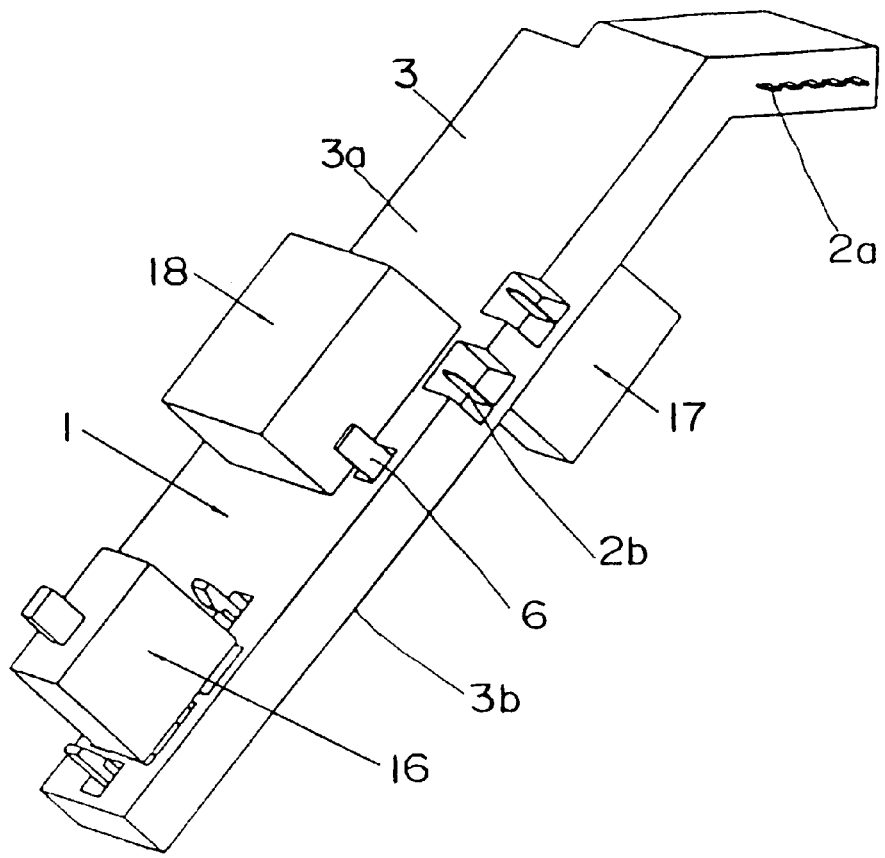
FIG. 18 is a view similar to that of FIG. 1, with a variety of electrical devices or parts mounted on the three-dimensional circuit structure.

Finally, FIG. 18 shows a plurality of electrical devices or parts 16, 17 and 18 removably mounted on the top and bottom sides 3a and 3b, respectively, of molded dielectric substrate 3. These components may comprise a wide variety of electrical devices, such as switches, relays or the like. Although latches 6 are not shown as being used with the components in FIG. 18, the latches might be used for engaging complementary latch means on other components to hold the components to the molded substrate. The entire assembly shown in FIG. 18 further can be interconnected with an outside circuit structure by using terminal blades 2a to plug the structure into the outside structure.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

I claim:

1. A molded electrical interconnection system, comprising:

a three-dimensional molded dielectric substrate including at least one open socket;

stamped and formed electrical circuitry embedded in the molded substrate and including a contact blade projecting into said socket; and an interface module positioned in the socket to define a receptacle for receiving a male terminal of a complementary connecting device and including an interconnecting terminal for interconnecting the male contact of the electrical circuitry with the male terminal of the complementary connecting device and a dielectric block generally of the configuration of said socket, with the interconnecting terminal mounted in the dielectric block.

2. A molded electrical interconnection system, comprising:

a three-dimensional molded dielectric substrate including at least one open socket;

stamped and formed electrical circuitry embedded in the molded substrate and including a contact blade projecting into said socket; and an interface module positioned in the socket to define a receptacle for receiving a male terminal of a complementary connecting device, the interface module including a dielectric block generally of the configuration of said socket and an interconnecting terminal mounted in the dielectric block for interconnecting the contact blade of the electrical circuitry with the male terminal of the complementary connecting device, the interconnecting terminal being generally S-shaped to define two resilient legs at opposite ends thereof, one of the legs being adapted for engaging the contact blade of the electrical circuitry and the other leg being adapted to engage the male terminal of the complementary connecting device and said other leg being located to sandwich the male terminal of the complementary connecting device between the other leg and a wall of the socket.

3. An electrical interconnection system, comprising:

a three-dimensional dielectric substrate including at least one recess;

stamped and formed electrical circuitry embedded on the substrate and including a male contact projecting into said recess; and a terminal block positioned in the recess to define a receptacle for receiving a male terminal of a complementary connecting device and including an interconnecting terminal for interconnecting the male contact of the electrical circuitry with the male terminal of the complementary connecting device and a dielectric housing generally of the configuration of said recess, with the interconnecting terminal mounted in the housing.

4. A molded electrical interconnection system, comprising:

a three-dimensional molded dielectric substrate including at least one open socket;

stamped and formed electrical circuitry embedded in the molded substrate and including a contact blade projecting into said socket;

an interface module positioned in the socket to define a receptacle for receiving a male terminal of a complementary connecting device and including an interconnecting terminal for interconnecting the contact blade of the electrical circuitry with the male terminal of the complementary connecting device; and the interconnecting terminal being generally S-shaped to define two resilient legs at opposite ends thereof, one of the legs being adapted for engaging the contact blade of the electrical circuitry and the other leg being adapted to engage the male terminal of the complementary connecting device and the other leg being located to sandwich the male terminal of the complementary connecting device between the other leg and a wall of the socket.

5. An electrical interconnection system, comprising:

a three-dimensional dielectric substrate including at least one recess;

stamped and formed electrical circuitry embedded on the substrate and including a male contact projecting into said recess;

a terminal block positioned in the recess to define a receptacle for receiving a male terminal of a complementary connecting device and including an interconnecting terminal for interconnecting the male contact of the electrical circuitry with the male terminal of the complementary connecting device;

the interconnecting terminal being generally S-shaped to define two resilient legs at opposite ends thereof, one of the legs being adapted for engaging the male contact of the electrical circuitry and the other leg being adapted to engage the male terminal of the complementary connecting device; and the other leg being located to sandwich the male terminal of the complementary connecting device between the other leg and a wall of the socket.

\* \* \* \* \*